(12) United States Patent
Hasegawa (10) Patent No.: US 7,295,326 B2
(45) Date of Patent: Nov. 13, 2007

(54) APPARATUS AND METHOD FOR MEASURING THE OPTICAL PERFORMANCE OF AN OPTICAL ELEMENT

(75) Inventor: Masanobu Hasegawa, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 11/095,890

(22) Filed: Mar. 31, 2005

(65) Prior Publication Data

US 2005/0219549 A1   Oct. 6, 2005

(30) Foreign Application Priority Data

Mar. 31, 2004   (JP)   ............... 2004-104847

(51) Int. Cl.
*G01B 11/02* (2006.01)
(52) U.S. Cl. .................................... 356/515
(58) Field of Classification Search ............... 356/124, 356/511, 512, 515, 521
See application file for complete search history.

(56) References Cited

U.S. PATENT DOCUMENTS

| 5,362,956 | A | 11/1994 | Anafi et al. |
| 6,086,204 | A | 7/2000 | Magnante |
| 6,312,373 | B1 | 11/2001 | Ichihara |
| 6,650,421 | B2 * | 11/2003 | Magome ............ 356/521 |
| 6,833,904 | B1 * | 12/2004 | Komatsuda ............ 355/67 |
| 2003/0137654 | A1 | 7/2003 | Mizuno | |

FOREIGN PATENT DOCUMENTS

| JP | 2000-97666 A | 4/2000 |
| JP | 2003-121300 | 4/2003 |
| WO | WO 03/068057 | 8/2003 |

OTHER PUBLICATIONS

English Abstract of Japanese Published Application No. 2003-121300 (1 p.).
Communication from the European Patent Office in European Application No. 05006889.9, dated Apr. 5, 2006 (3 pp.).
Full English Translation of JP 2003-121300, published Apr. 23, 2003.

* cited by examiner

*Primary Examiner*—Michael A. Lyons
(74) *Attorney, Agent, or Firm*—Morgan & Finnegan LLP (57) ABSTRACT

A measuring apparatus includes a first measuring system for measuring optical performance of a target optical system using a light splitting optical element, and a second measuring system for measuring optical performance of the optical element.

3 Claims, 8 Drawing Sheets

PRIOR ART

FIG. 9

APPARATUS AND METHOD FOR MEASURING THE OPTICAL PERFORMANCE OF AN OPTICAL ELEMENT

CROSS-REFERENCE TO RELATED APPLICATIONS

This application claims foreign priority benefits based on Japanese Patent Application No. 2004-104847, filed on Mar. 31, 2004, which is hereby incorporated by reference herein in its entirety as if fully set forth herein.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The present invention relates to an apparatus and method that measure the optical performance of an optical element, and more particularly to a measuring apparatus and method used for an exposure apparatus of a step-and-repeat manner, a step-and-scan manner, etc. for manufacturing devices, e.g., semiconductor devices such as ICs, LSIs, etc., image pick-up devices such as CCDs, etc., and display devices such as liquid crystal panels, etc. The present invention is also directed to an exposure apparatus and method using the measuring apparatus and method, and a device manufacturing method.

2. Description of Related Art

The recent fine processing increasingly requires a projection exposure apparatus to improve the resolving power. A higher numerical aperture ("NA") of a projection optical system is effective to the improvement of the resolving power, and the projection exposure apparatus should precisely transfer a mask pattern onto a wafer at a predetermined magnification (or a reduction ratio). This requirement is met through use of a projection optical system that has good imaging performance and little aberration. Since the minimum critical dimension or resolution transferable by the projection exposure apparatus is in proportion to the exposure light's wavelength, use of a shorter wavelength makes the resolution finer. Thus, the recent demands for finer processing to semiconductor devices promote a shorter wavelength from the ultra-high pressure mercury lamp (i-line having a wavelength about 365 nm) to a KrF excimer laser having a wavelength about 248 nm, an ArF excimer laser having a wavelength about 193 nm, and even extremely ultraviolet ("EUV") light having a wavelength between 10 nm and 15 nm. In this context, the measuring apparatus is required to accurately measure the aberration of the projection optical system in the exposure apparatus.

A method for measuring the aberration of the optical system includes, for example, a Hartmann test, and a method that utilizes interference. See, for example, Japanese Patent Application, Publication No. 2000-97666 and U.S. Pat. No. 6,312,373. Here, a brief description will be given of an illustrative measuring apparatus 1000 that utilizes a shearing interferometer.

Figure 9:
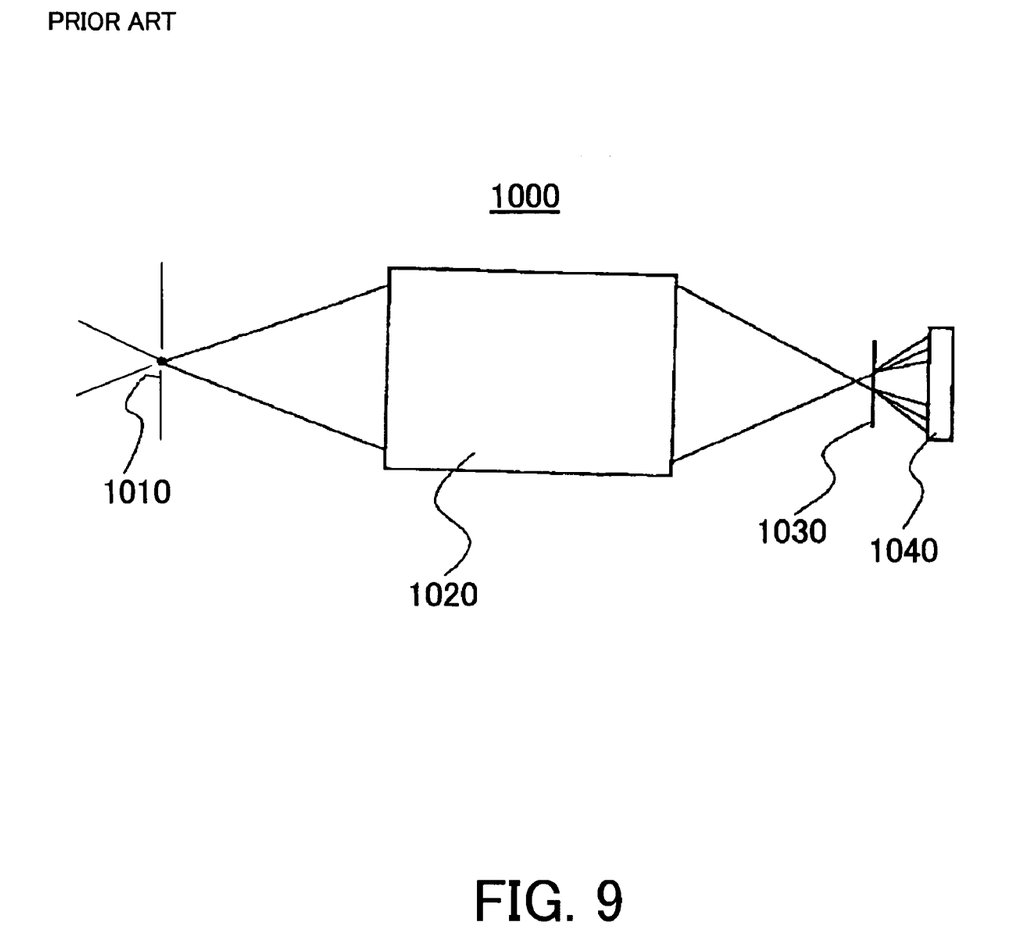
FIG. 9 is a schematic structure of a conventional aberration measuring apparatus.

The measuring apparatus 1000 includes, as shown in FIG. 9, a dedicated mask 1010, a target optical system 1020, an optical element 1030 having a beam splitting function, and an image detector 1040, such as a CCD. The dedicated mask 1010 generates an aplanatic spherical wave from the light emitted from a light source (not shown), and the aplanatic spherical wave enters the target optical system 1020. The light incident upon the target optical system 1020 is emitted with an aberration of the target optical system 1020, and enters the optical element 1030. The optical element 1030 is a diffraction grating, and splits the incident light into plural orders of diffracted lights. At least two orders of diffracted lights enter the image detector 1040. The image detector 1040 detects a shearing interference fringe, which occurs when two wave fronts split by the optical elements 1030 laterally offset and superimpose on each other. The shearing interference fringe contains information of the aberration of the target optical system 1020, and provides the wave front shape of the target optical system 1020 through integrations.

When the optical element 1030 as the diffraction grating is replaced with a Hartmann plate, the wave front is measured in accordance with the Hartmann test. The Hartmann plate is a light shielding plate having plural holes. The light incident upon the Hartmann plate is split into plural rays after passing the holes, and enters the image detector 1040. Since an incident position of each ray upon the image detector 1040 varies according to the optical performance (or aberration) of the target optical system 1020, the incident position of each ray detected by the image detector provides the wave front shape of the target optical system 1020.

BRIEF SUMMARY OF THE INVENTION

The present invention is directed to a measuring apparatus and method for measuring the aberration of a target optical system with high precision, and an exposure apparatus for providing high-resolution exposure.

A measuring apparatus according to one aspect of the present invention includes a first measuring system for measuring optical performance of a target optical system using a light splitting optical element, and a second measuring system for measuring optical performance of the optical element.

Other objects and further features of the present invention will become readily apparent from the following description of the preferred embodiments with reference to the accompanying drawings.

DETAILED DESCRIPTION OF THE PREFERRED EMBODIMENTS

As the NA of the projection optical system increases, the measuring apparatus 1000 needs higher measuring accuracy than ever. Then, the manufacturing errors and holding errors etc. of the optical element 1030 become problematic although they have not yet been problematic in the conventional measuring apparatus shown in FIG. 9. The measuring apparatus 1000 arranges the target optical system 1020 and the optical element 1030 between the dedicated mask 1010 and the image detector 1040. If the optical element 1030 has a manufacturing or holding error, a wave front obtained from the image detector 1040 contains an aberration of the target optical system 1020 and an aberration of the optical element 1030, and the measuring apparatus 1000 has a difficulty in precisely measuring the aberration of the target optical system 1020. An exposure apparatus that uses the target optical system 1020, such as a projection optical system cannot provide a high-resolution exposure, because it is difficult to sufficiently correct the aberration of the target optical system when the measuring apparatus 1000 cannot precisely measure the aberration.

The manufacturing error is, for example, an offset of a hole position in a Hartmann plate from a designed value, and the holding error is a physical offset of the holding position of the Hartmann plate from a designed value. For a diffraction grating, a shaping error etc. in manufacturing the grating is further influential.

Figure 1A:
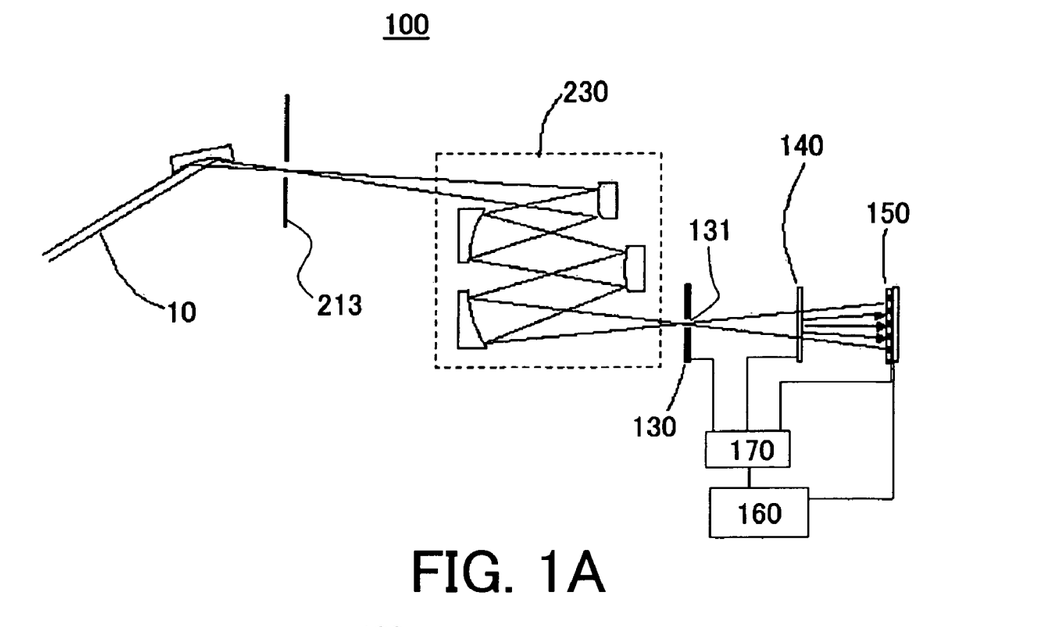
FIG. 1 is a schematic structure of an inventive measuring apparatus.

Referring now to the accompanying drawings, a description will be given of a measuring apparatus 100 according to one embodiment of the present invention, which can solve the above problem. Here, FIG. 1A shows a structure of the measuring apparatus 100 when a dedicated mask 130 is located on the optical path, and FIG. 1B shows a structure of the measuring apparatus 100 when a dedicated mask 130 retreats from the optical path.

The measuring apparatus 100 includes dedicated masks 130 and 213, an optical element 140, a detector 150 and a controller 160, and measures the optical performance, such as a wave front aberration including a curvature of field and a distortion, of a projection optical system 230 as a target optical system in this embodiment. The measuring apparatus 100 provides the optical element 140 and the dedicated mask for aberration measurements on the optical path of the projection optical system 230 that utilizes the EUV light, and measures the aberration of the optical element 140.

Figure 1B:
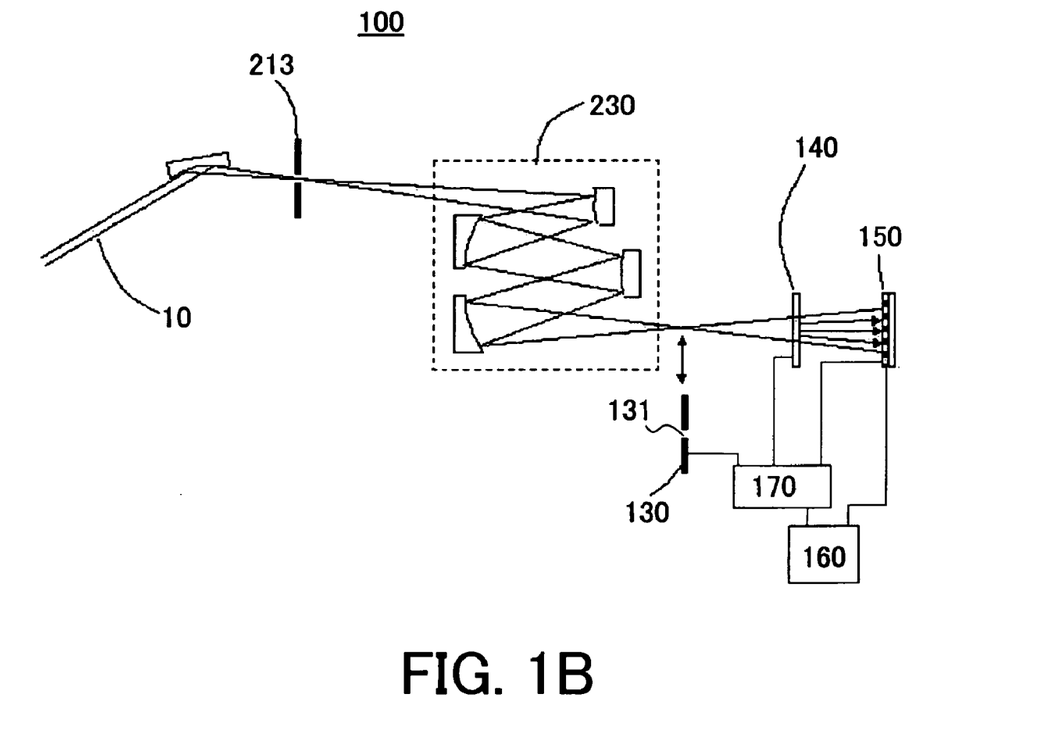

The dedicated mask 130 is used to correct the manufacturing and holding errors of the optical element 140, and retreats from the optical path in measuring the optical performance of the projection optical system 230, as shown in FIG. 1B. The dedicated mask 130 has a pinhole 131 that emits an ideal spherical wave with no aberration. The dedicated mask 130 is removably arranged between the projection optical system 230 and the optical element 140. The pinhole 131 is located at an arbitrary position on a mask 130 surface in a zone corresponding to the exposure area. The dedicated mask 130 is held by a driver 170 that drives the dedicated mask 130 on a plane perpendicular to an optical axis 10. A pinhole in the mask 213 is located at an object surface of the projection optical system. The pinhole 131 and a hole 141 in the optical element 140, which will be described later, have different sizes. The pinhole 131 is smaller than an Airy disc diameter condensed by the illumination NA of the projection optical system 230, and much smaller than the diameter of the hole 141. Thereby, the transmitting light diffracts at a spread angle corresponding to the NA of the illumination optical system. It is well known that the light diffracted from the pinhole 131 has no aberration.

Figure 2A:
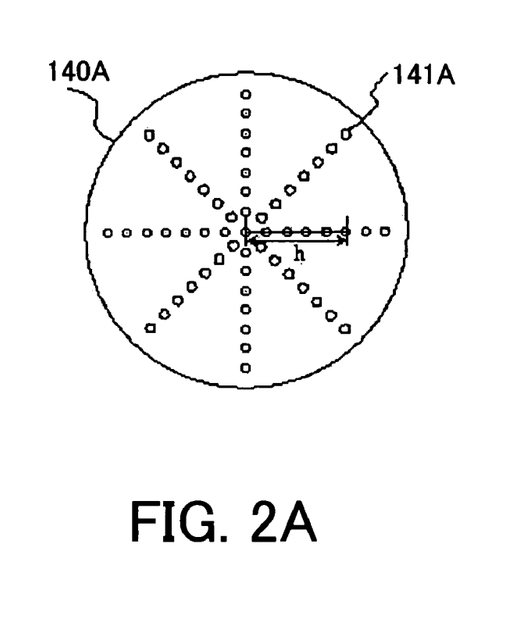
FIG. 2 is a schematic plane view showing an optical element used for the measuring apparatus shown in FIG. 1.
Figure 2B:
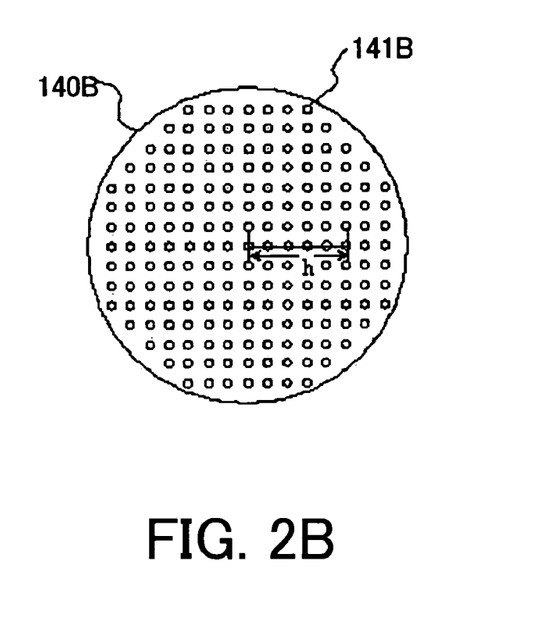

The optical element 140 in this embodiment is a Hartmann plate that splits the incident light into plural lights. The Hartmann plate has plural holes 141, as shown in FIGS. 2A and 2B, which are plane views of Hartmann plates 140A and 140B applicable to the optical element 140. The Hartmann plates 140A and 140B illustratively have a disc shape. As shown in FIG. 2A, the Hartmann plate 140A arranges seven holes 141A in a radial direction and the holes 141A are arranged at 45° intervals around the center of the disc. The Hartmann plate 140B arranges holes 141B at regular intervals in lateral and longitudinal directions as shown in FIG. 2B. The arrangements of the holes 141A and 141B are not limited as long as the designed condition, such as a light splitting function is maintained. The holes 141A and 141B are not limited to a circular shape, but may be elliptical and rectangular shapes as long as the above designed condition is met. The optical element 140 is removably inserted between the dedicated mask 130 and the detector 150.

The detector 150 receives the light split by the optical element 140, and uses a CCD in this embodiment. The detector 150 can use another device as long as it can receive the light split by the optical element 140.

The controller 160 controls the driver 170 that drives the dedicated mask 130.

Figure 4:
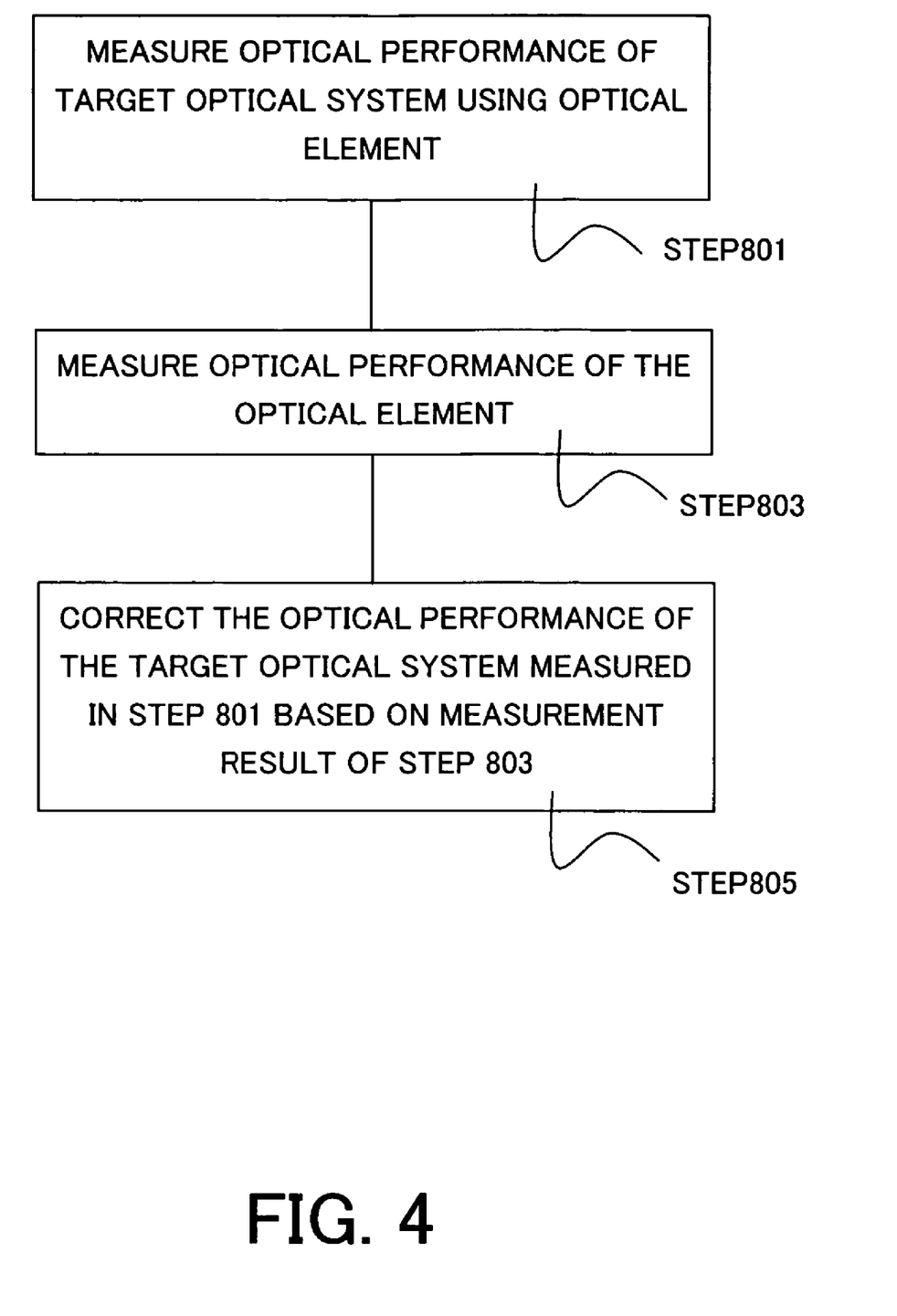
FIG. 4 is a flowchart of a measuring method using the measuring apparatus shown in FIG. 1.

Referring to a flowchart shown in FIG. 4, a description will be given of the measuring method using the inventive measuring apparatus 100. First, the optical performance of the target optical system (or the projection optical system 230 in this embodiment) is measured using the light splitting optical element 140 while the dedicated mask 130 is removed from the optical path as shown in FIG. 1B (step 801). The measuring apparatus 100 drives the driver 170, and inserts the optical element 140 and the detector 150 into the optical path of the projection optical system 230. The detector 150 outputs the result to the controller 160. The information from the detector 150 contains the aberration of the projection optical system 230 and the manufacturing and holding errors of the optical element 140, and is stored in a computer memory (not shown). Next follows a measurement of the optical performance of the optical element 140 (step 803). The measuring apparatus 100 drives the driver 170, and inserts the dedicated mask 130 into the optical path between the projection optical system 230 and the optical element 140. When the light from the projection optical system 230 passes through the pinhole 131, the dedicated mask 130 emits the ideal spherical wave that eliminates the influence of the aberration of the target optical system.

The ideal spherical wave is split into plural rays by the optical element 140, and enters the detector 150. The detector 150 sends obtained information to the controller 160, and the computer memory (not shown) stores this information.

This information contains the manufacturing and holding errors of the optical element 140, but does not contain information on the aberration of the projection optical system 230. The aberration of the projection optical system 230 is calculated based on the measurement results of two measurements (step 805), i.e., by subtracting the measurement value obtained in the step 803 from the measurement value obtained in the step 801. As a consequence, the measuring apparatus 100 can precisely measure the aberration of the projection optical system 230. The exposure apparatus 200 can provide highly precise exposure when using the projection optical system 230 whose aberration is measured by the measuring apparatus and then eliminated.

This embodiment uses the Hartmann plate for the optical element 140 and measures the optical performance in accordance with the Hartmann test. The present invention may apply shearing and other interference methods by using the diffraction grating for the optical element 140.

Figure 3:
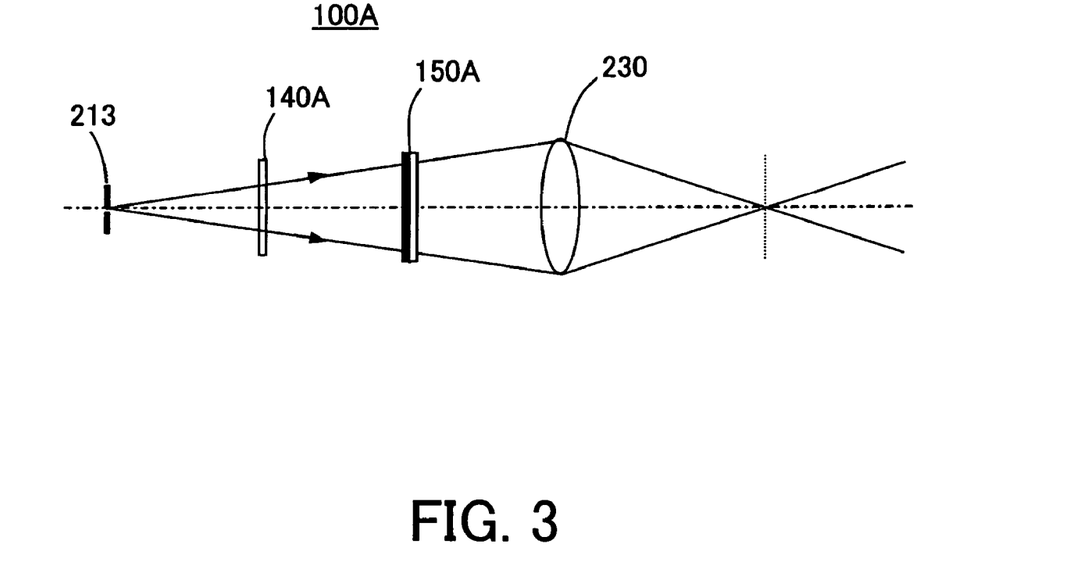
FIG. 3 is a schematic structure of a variation of the measuring apparatus shown in FIG. 1.

Referring now to FIG. 3, a description will be given of the measuring apparatus 100A according to another embodiment of the present invention. Here, FIG. 3 is a structure of the measuring apparatus 100A of the other embodiment. While the measuring apparatus 100A has a similar structure to that of the measuring apparatus 100, the arrangement of the optical element 140A and the detector 150A is different. This embodiment uses the mask 213 as a dedicated mask, and requires no dedicated mask for the optical element 140A. Therefore, the measuring apparatus 100A may reduce the number of elements. In addition, the reduced number of masks minimizes the reflection loss of the optical system, and corrects the optical element 140A. $NAi=\gamma NAo$ is met, where NAi is the NA of the projection optical system 230 at the incident side, the NAo is the NA of the projection optical system 230 at the exit side, and $\gamma$ is the angular magnification. A pair of the optical element 140A and the detector 150A is returned to the state shown in FIG. 1B. Therefore, prior to Step 805, the result obtained in the arrangement shown in FIG. 3 should be converted by multiplying the result by $\gamma$ as if the optical element 140A and the detector 150A are arranged subsequent to the projection optical system 230 as shown in FIG. 1B.

Figure 5:
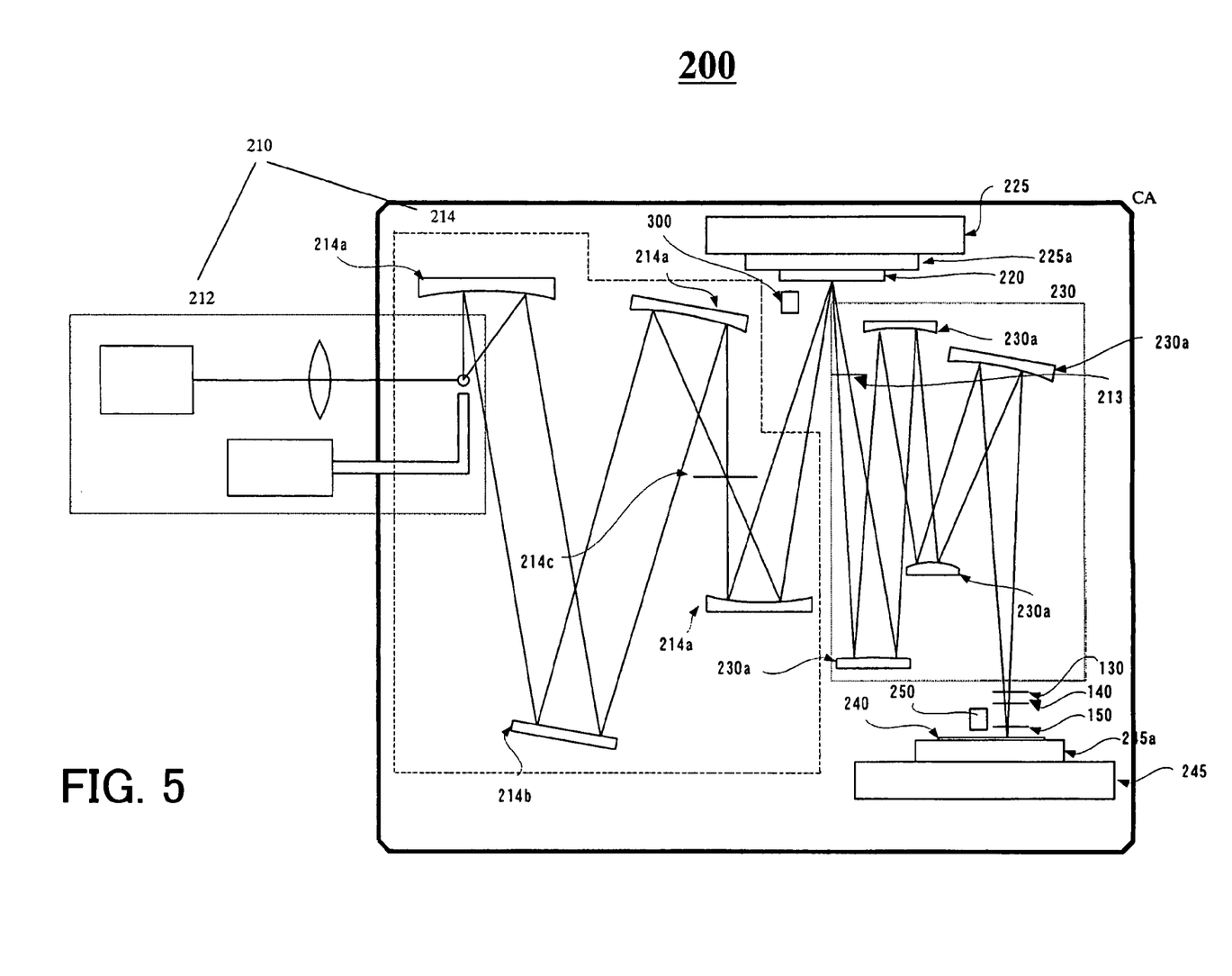
FIG. 5 is a schematic structure of an EUV exposure apparatus using the inventive aberration measuring apparatus shown in FIG. 1.

Referring now to FIG. 5, a description will be given of an illustrative exposure apparatus that applies the inventive measuring apparatus 100. Here, FIG. 5 is a schematic structure of the inventive illustrative exposure apparatus 200.

The inventive exposure apparatus 200 uses the EUV light (with a wavelength of, e.g., 13.4 nm) as illumination light for exposure, and exposes onto an object 240 a circuit pattern created on a mask 220, for example, in a step-and-scan manner or step-and-repeat manner. This exposure apparatus is suitable for a lithography process less than submicron or quarter micron, and this embodiment uses the step-and-scan exposure apparatus (also referred to as a "scanner") as an example. The "step-and-scan manner", as used herein, is an exposure method that exposes a mask pattern onto a wafer by continuously scanning the wafer relative to the mask, and by moving, after a shot of exposure, the wafer stepwise to the next exposure area to be shot. The "step-and-repeat manner" is another mode of exposure method that moves a wafer stepwise to an exposure area for the next shot every shot of cell projection onto the wafer.

Referring to FIG. 5, the exposure apparatus 200 includes an illumination apparatus 210, a mask 220, a mask stage 225 mounted with the mask 220, a projection optical system 230, an object to be exposed 240, a wafer stage 245 mounted with the object 240, an alignment detection mechanism 250, and a focus position detecting mechanism 260.

At least the optical path through which the EUV light travels (or the entire optical system) should preferably be maintained in a vacuum atmosphere CA, as shown in FIG. 5, since the EUV light has low transmittance for air and the residue gas component, such as a polymer organic gas, causes contaminations.

The illumination apparatus 210 illuminates the mask 220 using the arc-shaped EUV light (with a wavelength of, for example, 13.4 nm) corresponding to the arc field in the projection optical system 230, and includes an EUV light source 212 and an illumination optical system 214.

The EUV light source 212 uses, for example, a laser plasma light source. The laser plasma light source irradiates a highly intensified pulse laser beam to a target material put in vacuum, thus generating high-temperature plasma for use as EUV light with a wavelength of about 13.4 nm emitted from this. The target material may use a metallic thin film, inert gas, and droplets, etc. The pulse laser preferably has high repetitive frequency, e.g., usually several kHz, for increased average intensity of the emitted EUV light.

The illumination optical system 214 includes a condenser optical 214a and an optical integrator 214b. The condenser optical system 214a condenses the EUV light that is radiated approximately isotropically from the laser plasma. The optical integrator 214b uniformly illuminates the mask 220 at a predetermined NA. The illumination optical system 214 provides the aperture 214c that restricts the illumination area of the mask 220 to the arc shape at a position conjugate with the mask 220. The target optical system measured by the inventive measuring apparatus 100 is applicable to the illumination optical system 214.

The mask 220 is a reflection mask that has a circuit pattern (or image) to be transferred. It is supported and driven by the mask stage 225. The diffracted light emitted from the mask 220 is projected onto the object 240 after reflected by the projection optical system 230. The mask 220 and object 240 are arranged optically conjugate with each other. Since the exposure apparatus 200 is a scanner, the mask 220 and object 240 are scanned so as to project a reduced size of pattern on the mask 220, onto the object 240.

The mask stage 225 supports the mask 220, and is connected to a moving mechanism (not shown). The mask stage 225 may apply any structures known in the art. The moving mechanism (not shown) may include a linear motor, and move the mask 220 at least in the X direction. The exposure apparatus 200 synchronously scans the mask 220 and the object 240. Here, the X direction is a scanning direction on the mask 220 or the object 240, the Y direction is a direction perpendicular to the X direction, and the Z direction is a direction perpendicular to the mask 220 or the object 240.

The projection optical system 230 uses plural multilayer coating mirrors 230a to project a reduced size of a pattern of the mask 220 onto the object 240 as an image surface. The number of mirrors 230a is about four to six. For wide exposure area with the small number of mirrors, the mask 220 and object 240 are simultaneously scanned to transfer a wide area that is an arc-shaped area or ring field apart from the optical axis by a predetermined distance. The projection optical system 230 has a NA of about 0.2 to 0.3. The target optical system measured by the inventive measuring apparatus 100 is applicable to the projection optical system 230. In measuring the aberration of the projection optical system, a Hartmann plate having plural openings may be inserted into an optical path between the mask 220 and the fourth mirror 230a at a position where the exposure light does not superimpose.

The instant embodiment uses a wafer as the object to be exposed 240, but it may include a spherical semiconductor and liquid crystal plate and a wide range of other objects to be exposed. Photoresist is applied onto the object 240. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane) The pre-bake treatment is a baking (or burning) step, softer than that after development, which removes the solvent.

The object to be exposed 240 is held by the wafer stage 245 by a wafer chuck 245a. The wafer stage 245 moves the object 240, for example, using a linear motor in XYZ directions. The mask 220 and the object 240 are synchronously scanned. The positions of the reticle stage 225 and wafer stage 245 are monitored, for example, by a laser interferometer, and driven at a constant speed ratio.

The alignment detecting mechanism 250 measures a positional relationship between the position of the mask 220 and the optical axis of the projection optical system 230, and a positional relationship between the position of the object 240 and the optical axis of the projection optical system 230, and sets positions and angles of the reticle stage 225 and the wafer stage 245 so that a projected image of the mask 220 may accord with the object 240.

The focus detecting optical system 260 measures a focus position on the object 240 surface, and control over a position and angle of the wafer stage 245 always maintains the object 240 surface at an imaging position of the projection optical system 230 during exposure.

This embodiment can be implemented both with the EUV light and with the non-EUV light. Since the EUV exposure optical system is a catoptric optical system, no chromatic aberration occurs and light having a different wavelength is used for measurements.

The mirror for the EUV light has a multilayer coating that layers molybdenum (Mo) and silicon (Si), and a phase change differs between the EUV light and the non-EUV light at the time of reflection. Therefore, when the non-EUV light is used for measurement, it is necessary to previously obtain a correlation between a measurement value that uses the non-EUV light and a measurement value that uses the EUV light. A buffer layer made, for example, of $B_4C$ (boron carbide) may be formed at an interface between the Mo layer and Si layer to stabilize the interface.

Figure 6:
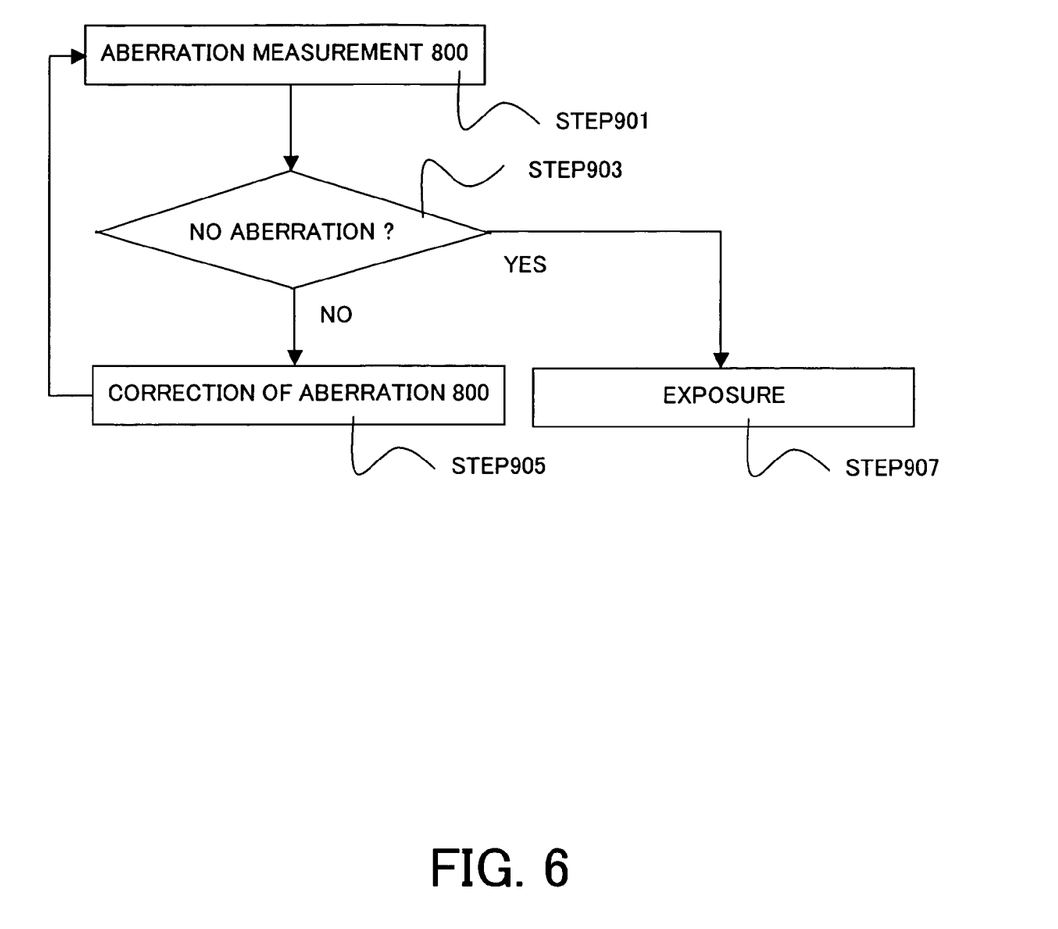
FIG. 6 is a flowchart of an exposure method executed by the exposure apparatus shown in FIG. 5.

Referring now to FIG. 6, a description will be given of an exposure method. Here, FIG. 6 is a flowchart of the exposure method executed by the exposure apparatus 200 that uses the inventive measurement apparatus 100. First, it is determined whether the above measurement method 800 (step 901) detects the aberration (step 903). The aberration correction follows when it is determined that there is an aberration (step 905), and resumes Step 901. On the other hand, the exposure follows when it is determined that there is no aberration (step 907). For the purpose of Step 905, the exposure apparatus 200 allows plural optical elements (not shown) in the projection optical system 230 to move in the optical-axis direction and/or a direction orthogonal to the optical-axis direction. By driving one or more optical elements using a driving system (not shown) for aberrational adjustments based on aberrational information obtained from the instant embodiment, it is possible to correct or optimize one or more aberrations of the projection optical system 230, in particular Zeidel's classification of aberrations. The means for adjusting the aberration of the projection optical system 230 can use various known systems, such as a movable lens, a movable mirror (when the projection optical system is a catadioptric or catoptric optical system), an inclinable planeparallel plate, a pressure-controllable space, and a surface correction using an actuator.

Thus, the exposure apparatus 200 corrects the surface accuracy of and adjusts the projection optical system 230 by using the measurement apparatus 100, providing the projection optical system 230 having a little aberration. When the measuring apparatus 100 is mounted on the exposure apparatus 200, the optical performance of the projection optical system 230 can be measured in situ or on the exposure apparatus 200 without arduously detaching the projection optical system 230 from the exposure apparatus 200.

In exposure, the EUV light emitted from the illumination apparatus 210 illuminates the mask 220, passes the projection optical system 230 that utilizes the inventive measuring apparatus 100, and images a pattern on the mask 220 surface onto the object 240. This embodiment uses an arc or ring shaped image surface, and exposes the entire surface of the mask 220 by scanning the mask 220 and the object 240 at a speed of a reduction ratio.

Figure 7:
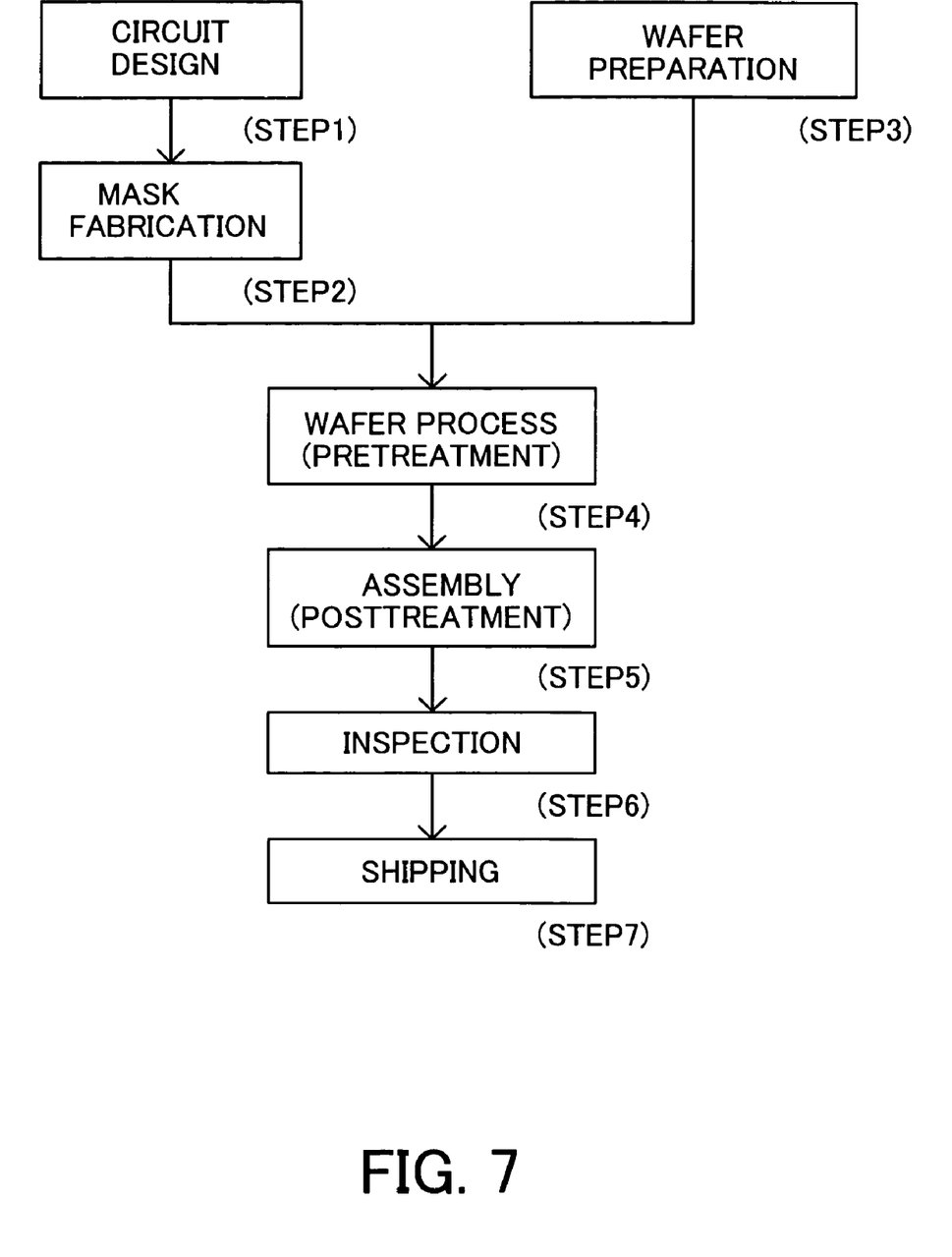
FIG. 7 is a flowchart for explaining a method for fabricating devices (semiconductor chips such as ICs, LSIs, and the like, LCDs, CCDs, etc.).
Figure 8:
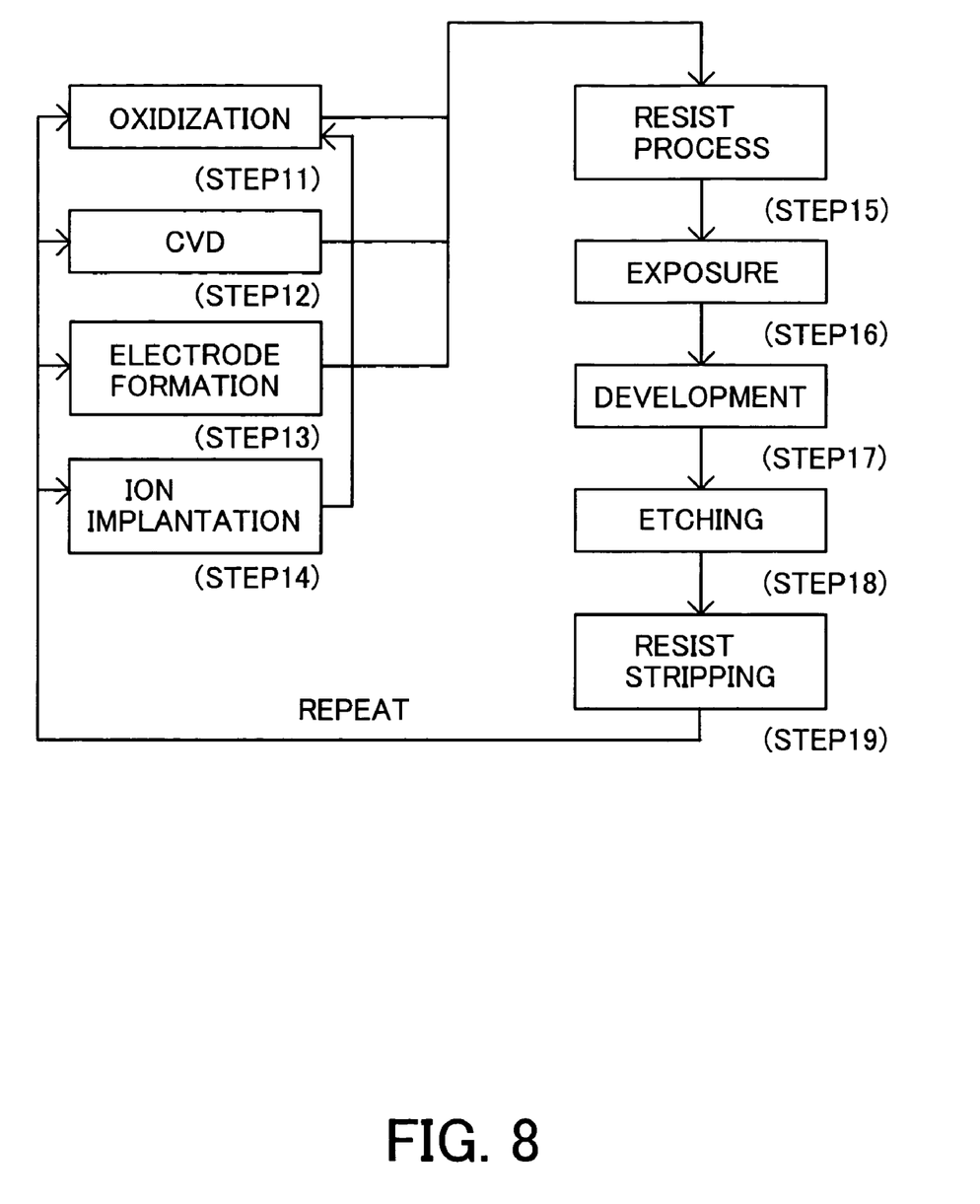
FIG. 8 is a detailed flowchart for Step 4 of wafer process shown in FIG. 7.

Referring now to FIGS. 7 and 8, a description will now be given of an embodiment of a device manufacturing method using the above exposure apparatus 200. FIG. 7 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 200 to expose a circuit pattern of a mask onto the wafer. Step 17 (development) develops the exposed wafer 47. Step 18 (etching) etches parts other than a developed resist image. Step 19 (resist stripping) removes disused resist after etching. These steps are repeated, and multilayer circuit patterns are formed on the wafer. The device manufacturing method of this embodiment can provide higher quality devices than the conventional.

The present invention thus can provide a measuring apparatus and method for measuring the aberration of a target optical system with high precision, and an exposure apparatus for providing high-resolution exposure.

Further, the present invention is not limited to these preferred embodiments, and various variations and modifications may be made without departing from the scope of the present invention.

What is claimed is:

1. A measuring apparatus comprising:
    a first measuring system for measuring optical performance of a target optical system, said first measuring system including:
        i) a first mask that has a first pinhole that introduces non-aberrational light to the target optical system;
        ii) a light splitting optical element for splitting light; and
        iii) a first light receiving section for receiving the light split by the optical element via the target optical system;
    a second measuring system for measuring optical performance of the optical element, said second measuring system including a second light receiving section for receiving the light split by the optical element, wherein said second measuring system arranges the optical element and the second light receiving section between the first mask and the target optical system; and
    a controller for correcting a measurement result of the target optical system measured by said first measuring system, based on a measurement result of said second measuring system and a ratio between a numerical aperture of the target optical system at an incident side and a numerical aperture of the target optical system at an exit side.

2. An exposure apparatus comprising:
    a projection optical system for transferring a pattern of a mask onto an object to be exposed, by using light from a light source; and
    a measuring apparatus according to claim 1 for measuring optical performance of the projection optical system.

3. A device manufacturing method comprising the steps of:
    exposing an object using an exposure apparatus; and
    developing the object exposed by said exposing step,
    wherein the exposure apparatus includes:
    a projection optical system for transferring a pattern of a mask onto an object to be exposed, by using light from a light source; and
    a measuring apparatus according to claim 1 for measuring optical performance of the projection optical system.

* * * * *